(12) United States Patent
Chang (10) Patent No.: US 12,130,318 B2
(45) Date of Patent: Oct. 29, 2024

(54) TESTING BASE

(71) Applicant: TMY Technology Inc., Taipei (TW)

(72) Inventor: Su-Wei Chang, Taipei (TW)

(73) Assignee: TMY Technology Inc., New Taipei (TW)

( * ) Notice: Subject to any disclaimer, the term of this patent is extended or adjusted under 35 U.S.C. 154(b) by 155 days.

(21) Appl. No.: 17/985,911

(22) Filed: Nov. 14, 2022

(65) Prior Publication Data

US 2023/0152361 A1     May 18, 2023

Related U.S. Application Data

(60) Provisional application No. 63/279,684, filed on Nov. 16, 2021.

(30) Foreign Application Priority Data

Oct. 4, 2022    (TW) .................................. 111137685

(51) Int. Cl.
*G01R 29/10*     (2006.01)
(52) U.S. Cl.
CPC .................................. *G01R 29/10* (2013.01)
(58) Field of Classification Search
CPC ....................................................... G01R 29/10
See application file for complete search history.

(56) References Cited

U.S. PATENT DOCUMENTS 10,680,727 B2    6/2020   Lu et al.
11,193,972 B2 *  12/2021  Fang .................. G01R 31/2896
2015/0048980 A1 * 2/2015  Chin .................. G01R 31/2822
                                                343/703
2016/0025788 A1 * 1/2016  Fujita .................... G01R 1/045
                                                343/703
2019/0162767 A1   5/2019  Wang et al.

FOREIGN PATENT DOCUMENTS

| CN | 210894514 | 6/2020 |
|---|---|---|
| TW | 200928382 | 7/2009 |
| TW | 201913133 | 4/2019 |
| TW | M580686 | 7/2019 |
| TW | M587835 | 12/2019 |
| TW | 202111343 | 3/2021 |
| TW | M637583 | 2/2023 |

OTHER PUBLICATIONS

"Office Action of Taiwan Counterpart Application", issued on Aug. 30, 2023, p. 1-p. 6.

* cited by examiner

*Primary Examiner* — Paresh Patel
(74) *Attorney, Agent, or Firm* — JCIPRNET (57) ABSTRACT

A testing base includes a housing, a carrier, a wave absorber, and a filler. The housing has an inner surface. The carrier is disposed on the housing. The carrier includes an upper surface, a lower surface, and a groove recessed in the upper surface. The groove is adapted for accommodating a component to be tested. The lower surface and the inner surface of the housing define a cavity body together. The wave absorber is disposed on the inner surface of the housing. The filler is filled in the cavity body and contacts the wave absorber and the carrier. A relative permittivity of the filler is less than or equal to 2.

9 Claims, 7 Drawing Sheets

TESTING BASE

CROSS-REFERENCE TO RELATED APPLICATION

This application claims the priority benefits of U.S. application Ser. No. 63/279,684, filed on Nov. 16, 2021, and Taiwan application serial no. 111137685, filed on Oct. 4, 2022. The entirety of each of the above-mentioned patent applications is hereby incorporated by reference herein and made a part of this specification.

BACKGROUND

Technical Field

This disclosure relates to a testing base, and in particular to a testing base adapted for antennas.

Description of Related Art

The radiation pattern of a planar antenna (especially a patch antenna) varies with a feed point, so measurement and verification procedures are usually taken to verify the characteristics of a planar antenna. The conventional test method is to conduct the test through the detection system as shown in FIG. 1.

Figure 1:
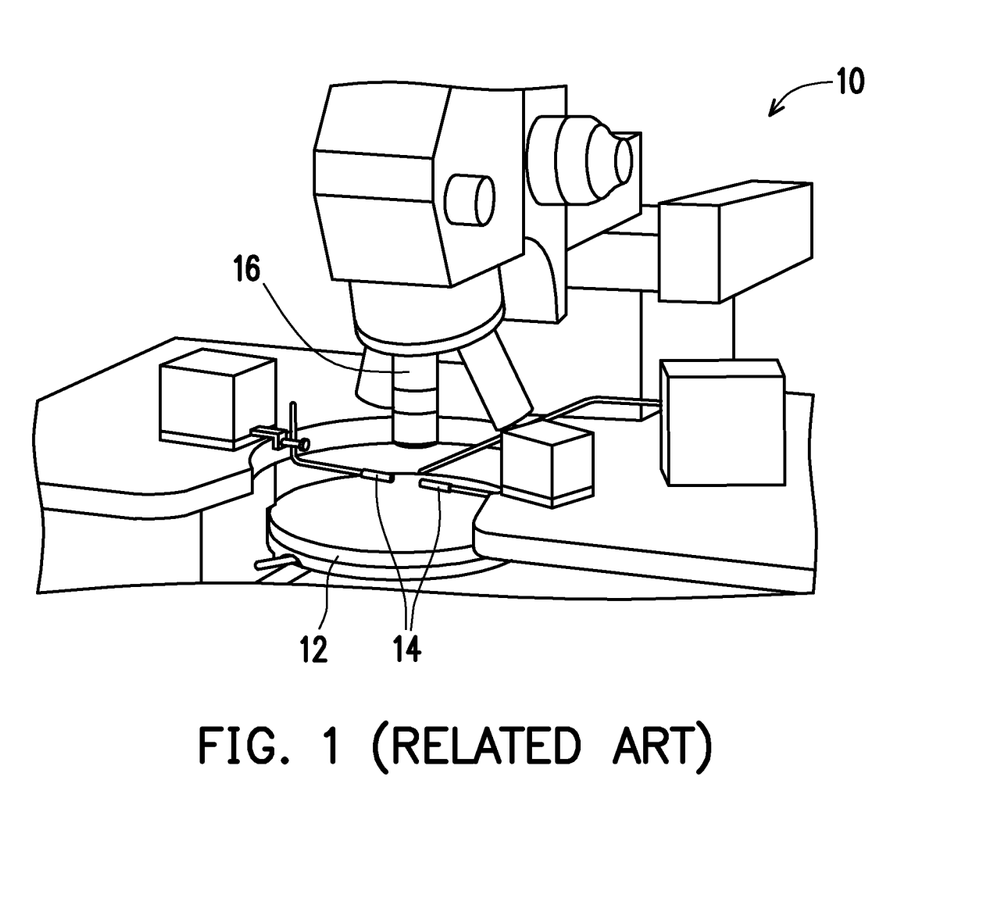
FIG. 1 is a schematic diagram of a conventional detection system.

FIG. 1 is a schematic diagram of a conventional detection system. Referring to FIG. 1, a detection system 10 includes a platform 12, two probes 14, and a microscope lens 16. The platform 12 is configured to carry a component to be tested (e.g., a planar antenna, not shown). The two probes 14 are located above the platform 12 and configured to contact the feed point and a ground point of the component to be tested. The microscope lens 16 is located above the platform 12 and the two probes 14. However, the radiation pattern of the component to be tested is actually affected by the nearby metal, making it difficult to obtain more realistic test results.

SUMMARY

The disclosure provides a testing base, capable of helping provide more realistic test results.

A testing base of the disclosure includes a housing, a carrier, a wave absorber, and a filler. The housing has an inner surface. The carrier is disposed on the housing. The carrier includes an upper surface, a lower surface, and a groove recessed in the upper surface. The groove is adapted for accommodating a component to be tested. The lower surface and the inner surface of the housing define a cavity body together. The wave absorber is disposed on the inner surface of the housing. The filler is filled the cavity body and contacts the wave absorber and the carrier. A relative permittivity of the filler is less than or equal to 2.

In an embodiment of the disclosure, a thickness of the carrier corresponding to the groove is less than 5 mm.

In an embodiment of the disclosure, the carrier includes a through hole. The through hole is located in the groove and is connected from the upper surface of the carrier to the lower surface of the carrier.

In an embodiment of the disclosure, the wave absorber is further disposed on a part of the lower surface of the carrier corresponding to a part outside the groove.

In an embodiment of the disclosure, the lower surface is a plane.

In an embodiment of the disclosure, the lower surface is a curved surface.

In an embodiment of the disclosure, a diameter or a length of the groove is D cm, a wavelength of a radiation signal of the component to be tested adapted for the testing base is greater than or equal to $\lambda$ cm, and a depth of the cavity body is greater than or equal to $2D^2/\lambda$ cm.

In an embodiment of the disclosure, an equivalent relative permittivity of the filler is between 1.2 and 1.6.

In an embodiment of the disclosure, the filler includes multiple filler layers, the filler layers have multiple different relative permittivities, and the relative permittivities of the filler layers are greater along a direction farther away from the carrier.

In an embodiment of the disclosure, a material of the filler includes foamed polytetrafluoroethylene (PTFE) or foamed polyethylene (PE) with a foaming degree between 50% and 80%.

Based on the above, the lower surface of the carrier of the testing base of the disclosure and the inner surface of the housing define the cavity body together. The wave absorber is disposed on the inner surface of the housing. The filler is filled in the cavity body. The relative permittivity of the filler is less than or equal to 2. The component to be tested is located in the groove recessed in the upper surface of the carrier. The wave absorber is configured to absorb energy radiated downward by the component to be tested (e.g., a planar antenna) to better simulate an open environment. The filler provides support to the carrier, and the relative permittivity of the filler is less than or equal to 2, which is closer to the air environment. The testing base of the disclosure may better simulate the open air environment and help provide more realistic test results.

To make the aforementioned more comprehensible, several accompanied with drawings are described in detail as follows.

BRIEF DESCRIPTION OF THE DRAWING

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 2A:
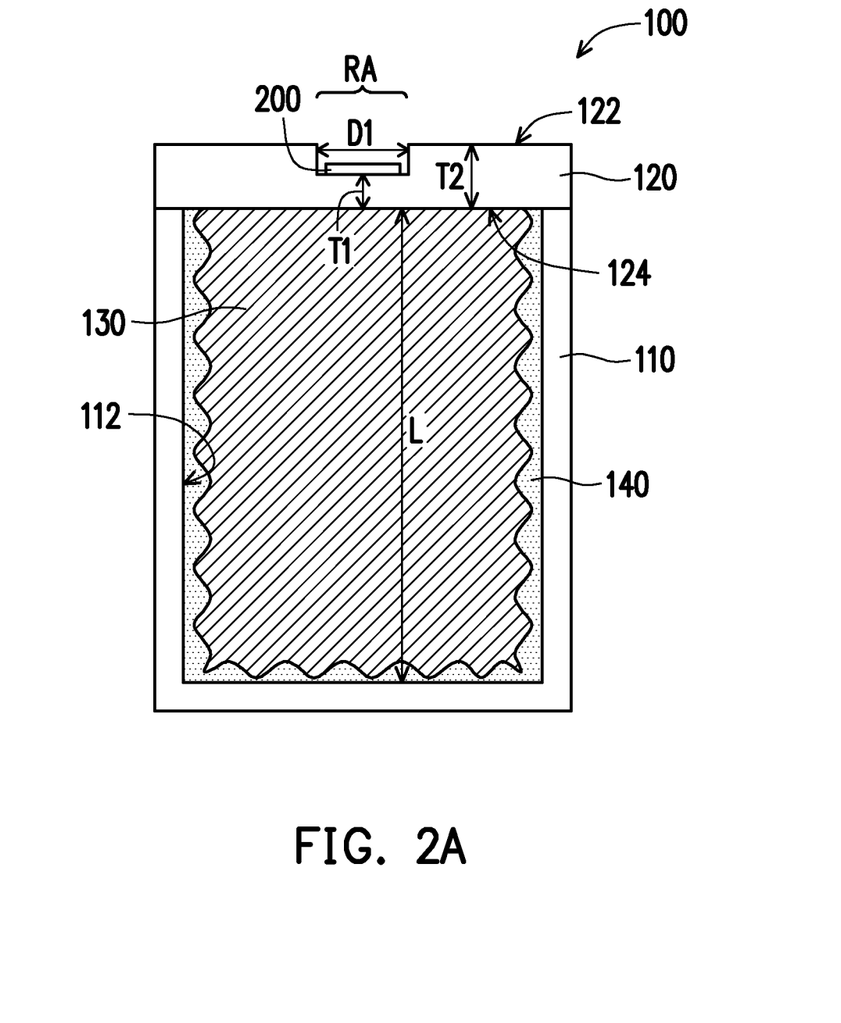
FIG. 2A is a schematic diagram of a testing base according to an embodiment of the disclosure.

FIG. 2A is a schematic diagram of a testing base according to an embodiment of the disclosure. Referring to FIG. 2A, a testing base 100 according to this embodiment may replace a platform of a conventional detection system (e.g., a platform 12 of FIG. 1) to provide better testing conditions.

The testing base 100 according to this embodiment includes a housing 110, a carrier 120, a wave absorber 140, and a filler 130.

In this embodiment, the housing 110 is, for example, a box or a hollow cylinder, and a material of the housing 110 may be metallic or non-metallic material. The carrier 120 is, for example, a plate disposed on the housing 110. A material of the carrier 120 is non-metallic, such as a low-dielectric ceramic material.

The carrier 120 includes an upper surface 122, a lower surface 124, and a groove RA recessed in the upper surface 122. The groove RA is adapted for accommodating a component to be tested 200. In this embodiment, the component to be tested 200 is, for example, a planar antenna (patch antenna), but the type of the component to be tested 200 is not limited thereto.

In this embodiment, the upper surface 122 of the carrier 120 is a plane outside the groove RA, and the lower surface 124 of the carrier 120 is a plane. That is, the carrier 120 is substantially equal in thickness outside the groove RA. In this embodiment, a thickness T1 of a part of the carrier 120 corresponding to the groove RA is less than 5 mm, and a thickness T2 of a part of the carrier 120 outside the groove RA is greater than 10 mm. The smaller thickness T1 of the part of the carrier 120 corresponding to the groove RA reduces a chance of the carrier 120 blocking a signal radiated downward by the component to be tested 200.

The wave absorber 140 is disposed on an inner surface 112 of the housing 110. The wave absorber 140 is configured to absorb energy of a radiation signal and reduce a chance of energy reflection. A material of the wave absorber 140 is, for example, foam sponge, but the material of the wave absorber 140 is not limited thereto. In an embodiment not shown, the wave absorber 140 may have a multi-layer structure, so that the energy of the radiation signal may be rapidly attenuated therein.

The lower surface 124 of the carrier 120 and the inner surface 112 of the housing 110 define a cavity body together. The filler 130 is filled in the cavity body, and contacts the wave absorber 140 and the carrier 120 to provide good and stable support. In this embodiment, a relative permittivity of the filler 130 is less than or equal to 2.

Specifically, as can be seen from Table 1 below, the relationship between a foaming degree of the filler 130 and an equivalent relative permittivity can be seen from Table 1 below. The smaller the foaming degree, the better the support, but the greater the equivalent relative permittivity. In this embodiment, the filler 130 is intended to be configured to provide support, which requires a certain level of supporting property. However, since the environment inside the cavity body is meant to simulate an air environment, the closer the environment inside the cavity body is to air (the equivalent relative permittivity of 1), the better. Therefore, the equivalent relative permittivity of the filler 130 needs to be balanced with the supporting property. In a preferred embodiment, the equivalent relative permittivity of the filler 130 is between 1.2 and 1.6. A material of the filler 130 includes foamed polytetrafluoroethylene (PTFE) or foamed polyethylene (PE) with a foaming degree between 50% and 80%.

TABLE I

| foaming degree (%) | equivalent relative permittivity |
| --- | --- |
| 0 | 2.32 |
| 10 | 2.16 |
| 20 | 2.01 |
| 30 | 1.86 |
| 40 | 1.72 |
| 50 | 1.59 |
| 60 | 1.46 |
| 70 | 1.34 |
| 80 | 1.22 |
| 90 | 1.15 |

Furthermore, in this embodiment, a depth L of the cavity body is related to a wavelength and a size of the radiation signal of the component to be tested 200. The size of the component to be tested 200 is close to a diameter D1 of the groove RA. If the diameter D1 or a length of the groove RA is D cm, the wavelength of the radiation signal of the component to be tested 200 adapted for the testing base 100 is greater than or equal to λ cm, and the depth L of the cavity body is greater than or equal to $2D^2/\lambda$ cm.

For example, a millimeter-wave FR2 frequency band is about 26 GHz to 30 GHz, a corresponding wavelength λ is about 1 cm for 30 GHz, and if the diameter D1 of the groove RA is 5 cm, it can be seen by bringing in the above formula that when the depth L or a height of the cavity body is about 50 cm, the frequency band below 30 GHz may be satisfied.

If the platform 12 of a detection system 10 of FIG. 1 is replaced by the testing base 100 of this embodiment, the component to be tested 200 radiates downward into the testing base 100, while the microscope lens 16 probes above the testing base 100. There is a wave absorber 140 inside the testing base 100, which absorbs the energy of the radiation signal and makes the reflected energy smaller, and the relative permittivity of the filler 130 is less than or equal to 2, making the testing base 100 similar to the open air environment, closer to the actual use of the state, which helps to get a more realistic test result of antenna characteristics such as S11 of the component to be tested 200. Thus, the antenna characteristics obtained by using the testing base 100 of this embodiment to carry the component to be tested 200 may be less affected by the metal above the testing base 100 than in the conventional way.

The following is a description of the main differences between the testing bases of other implementations. The identical or similar components are indicated by the same or similar symbols and are not repeated in the following.

Figure 2B:
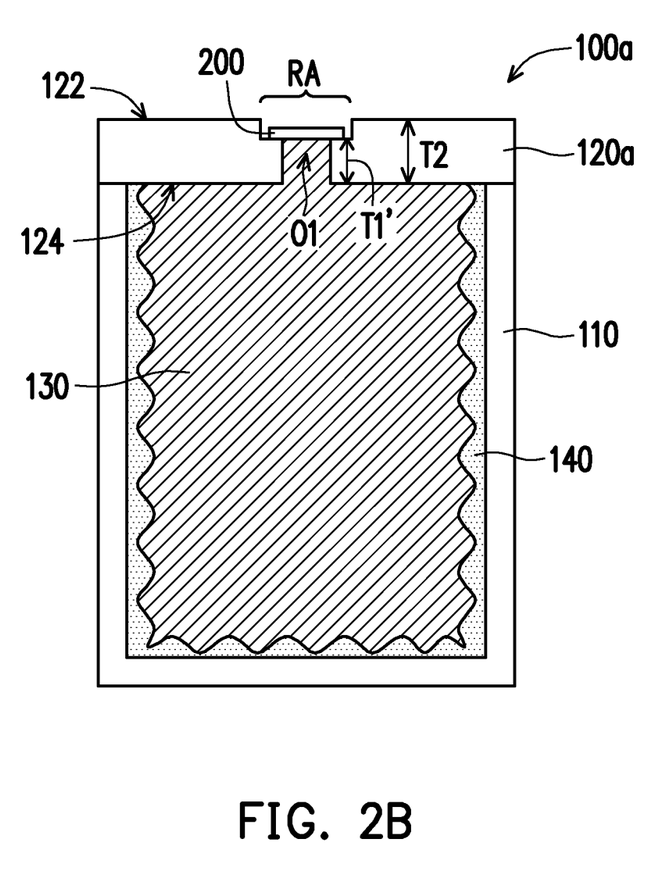
FIG. 2B is a schematic diagram of a testing base according to another embodiment of the disclosure.

FIG. 2B is a schematic diagram of a testing base according to another embodiment of the disclosure. Referring to FIG. 2B, the main difference between a testing base 100a of FIG. 2B and the testing base 100 of FIG. 2A is that, in this embodiment, a carrier 120a of the testing base 100a includes a through hole O1, and the through hole O1 is located in the groove RA and is connected from the upper surface 122 of the carrier 120a to the lower surface 124 of the carrier 120a. The through hole O1 may help the radiation signal transmission of the component to be tested 200, and reduce the influence of the testing base material and structure on the characteristics of the component to be tested 200.

In this embodiment, since the carrier 120a is provided with a through hole O1 at the groove RA, a thickness T1' of a part of the carrier 120a corresponding to the groove RA may be greater, for example, 8 mm, to provide good support.

Figure 2C:
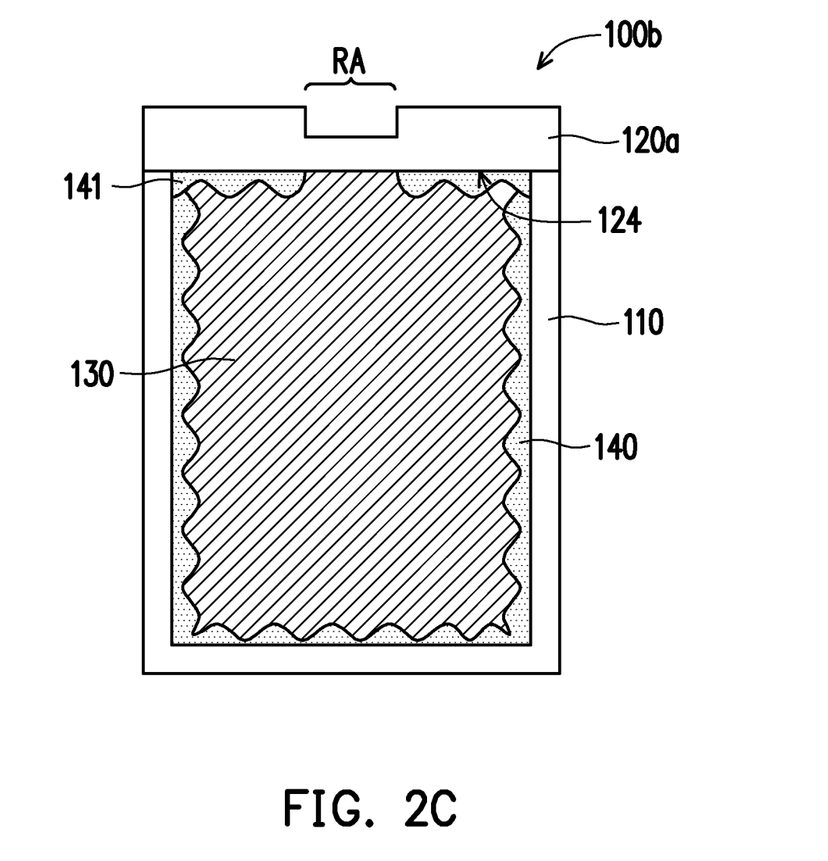
FIG. 2C is a schematic diagram of a testing base according to another embodiment of the disclosure.

FIG. 2C is a schematic diagram of a testing base according to another embodiment of the disclosure. Referring to FIG. 2C, the main difference between a testing base 100b of FIG. 2C and the testing base 100 of FIG. 2A is that, in this embodiment, the testing base 100*b* further includes a wave absorber 141 disposed on a part of the lower surface 124 of the carrier 120*a* corresponding to a part outside the groove RA. That is, in this embodiment, the testing base 100*b* includes a wave absorber 140 disposed on the inner surface 112 of the housing 110 and a wave absorber 141 disposed on a part of the lower surface 124 of the carrier 120*a* corresponding to a part outside the groove RA, and provides better absorbency.

Figure 3A:
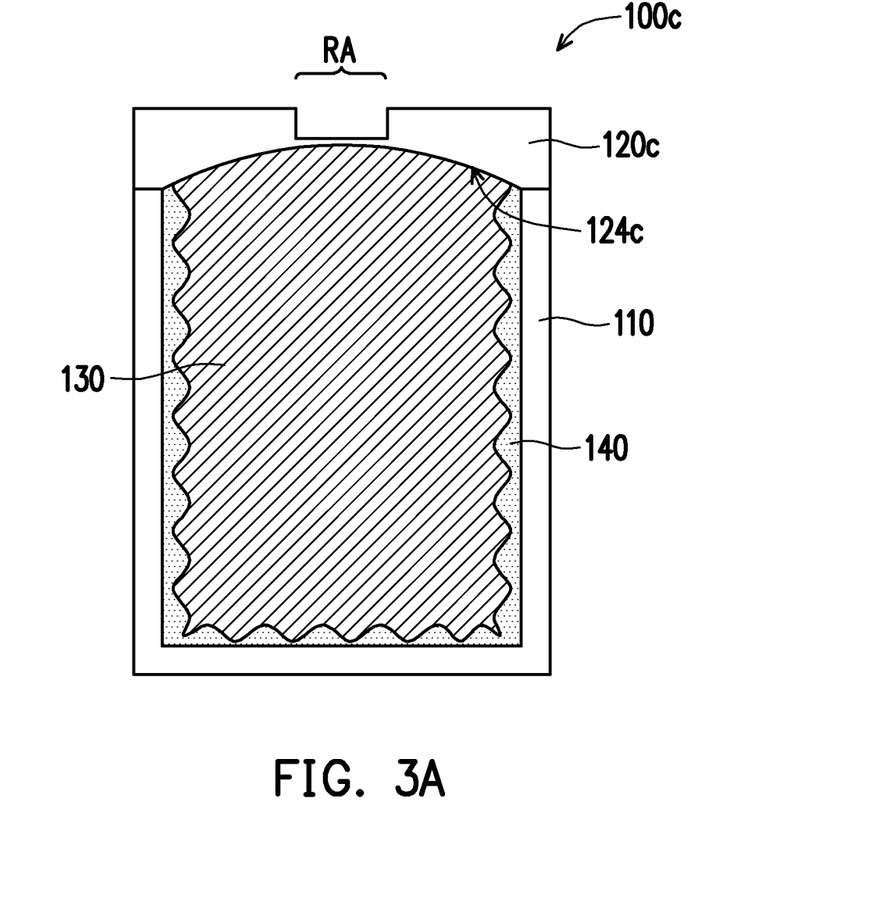
FIG. 3A is a schematic diagram of a testing base according to another embodiment of the disclosure.

FIG. 3A is a schematic diagram of a testing base according to another embodiment of the disclosure. Referring to FIG. 3A, the main difference between a testing base 100*c* of FIG. 3A and the testing base 100 of FIG. 2A is that, in this embodiment, a lower surface 124*c* of a carrier 120*c* is a curved surface, while making the carrier 120*c* close to an arch structure.

The lower surface 124*c* of the carrier 120*c* is designed, for example, along a local shape of a radiation pattern. The reason for this design is that a standard radiation pattern of an antenna is spherical, and if an antenna is placed in the groove RA and radiates towards the bottom of FIG. 3A, the signal is weak near the left and right side of the groove RA, which is not the location to be tested. Thus, the lower surface 124*c* of the carrier 120*c* being a curved surface does not affect the test result, and accordingly, the shape of the lower surface 124*c* of the carrier 120*c* may vary.

Figure 3B:
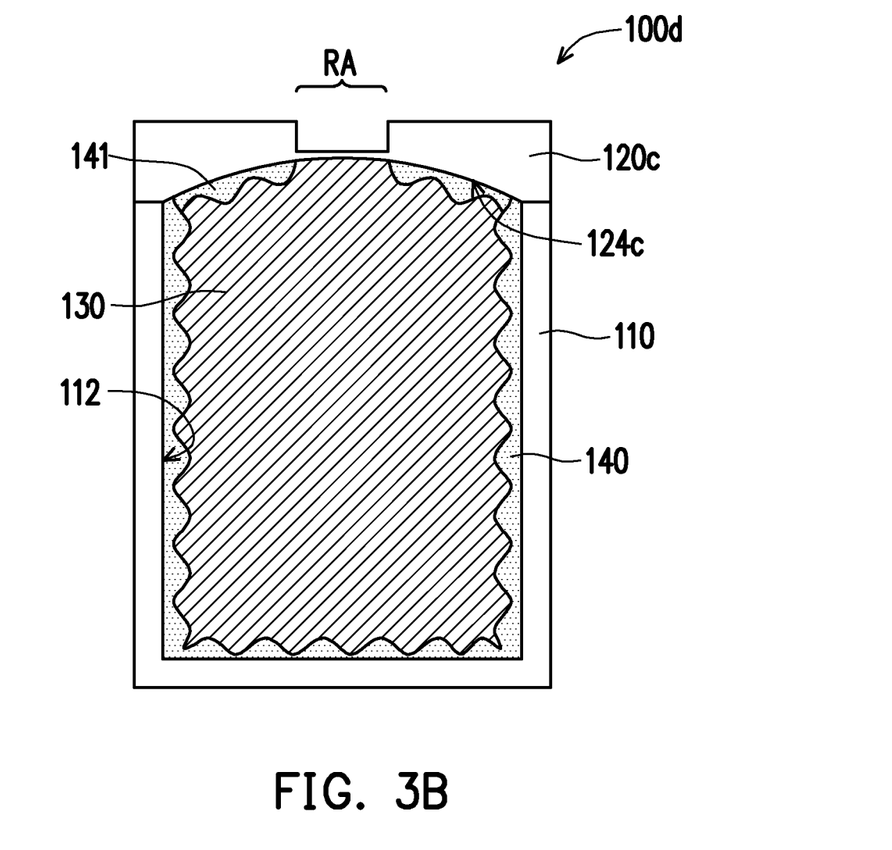
FIG. 3B is a schematic diagram of a testing base according to another embodiment of the disclosure.

In addition, the design of the lower surface 124*c* of the carrier 120*c* being curved (arch-shaped) may also increase the structural strength. Of course, in other embodiments, the lower surface of the carrier may also be other shapes FIG. 3B is a schematic diagram of a testing base according to another embodiment of the disclosure. Referring to FIG. 3B, the main difference between a testing base 100*d* of FIG. 3B and the testing base 100*c* in FIG. 3A is that, in this embodiment, the testing base 100*d* further includes a wave absorber 141 disposed on a part of the lower surface 124*c* of the carrier 120*c* corresponding to a part outside the groove RA. That is, in this embodiment, the testing base 100*d* includes a wave absorber 140 disposed on the inner surface 112 of the housing 110 and a wave absorber 141 disposed on a part of the lower surface 124*c* of the carrier 120*c* corresponding to a part outside the groove RA, and provides better absorbency.

Figure 4:
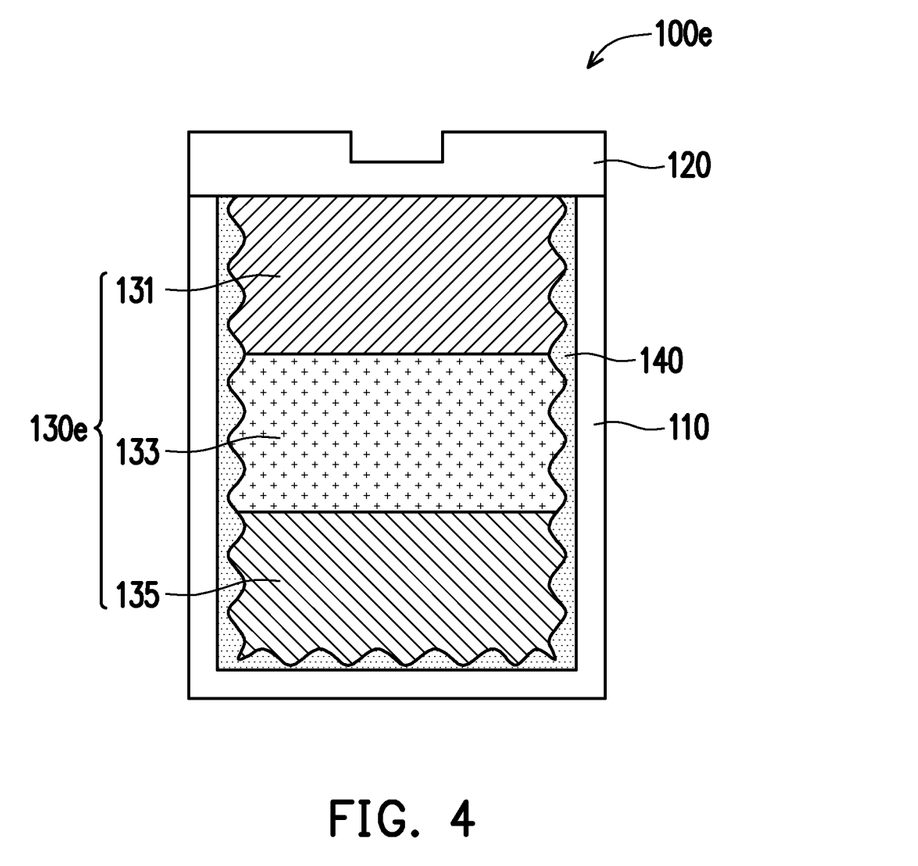
FIG. 4 is a schematic diagram of a testing base according to another embodiment of the disclosure.

FIG. 4 is a schematic diagram of a testing base according to another embodiment of the disclosure. Referring to FIG. 4, the main difference between a testing base 100*e* of FIG. 4 and the testing base 100 of FIG. 2A is that, in this embodiment, a filler 130*e* includes multiple filler layers 131, 133, and 135. The filler layers 131, 133, and 135 have different relative permittivities, and the relative permittivities of the filler layers 131, 133, and 135 are greater along a direction farther away from the carrier 120 (further down).

Specifically, the equivalent relative permittivity of the filler layer 131 is 1.22, and the foaming degree is, for example, 80%. The equivalent relative permittivity of the filler layer 133 is 1.34, and the foaming degree is, for example, 70%. The equivalent relative permittivity of the filler layer 135 is 1.46, and the foaming degree is, for example, 60%. In other words, in this embodiment, the farther the filler layers 131, 133, and 135 are from the carrier 120 (the further down), the smaller the foaming degree, and the stronger the support, to provide good support.

To sum up, the lower surface of the carrier of the testing base of the disclosure and the inner surface of the housing define the cavity body together. The wave absorber is disposed on the inner surface of the housing. The filler is filled in the cavity body. The relative permittivity of the filler is less than or equal to 2. The component to be tested is located in the groove recessed in the upper surface of the carrier. The wave absorber is configured to absorb energy radiated downward by the component to be tested (e.g., a planar antenna) to better simulate an open environment. The filler provides support to the carrier, and the relative permittivity of the filler is less than or equal to 2, which is closer to the air environment. The testing base of the disclosure may better simulate the open air environment and help provide more realistic test results.

It will be apparent to those skilled in the art that various modifications and variations can be made to the disclosed without departing from the scope or spirit of the disclosure. In view of the foregoing, it is intended that the disclosure covers modifications and variations provided that they fall within the scope of the following claims and their equivalents.

What is claimed is:

1. A testing base comprising:
    a housing having an inner surface;
    a carrier disposed on the housing, wherein the carrier comprises an upper surface, a lower surface, and a groove recessed in the upper surface, the groove is adapted for accommodating a component to be tested, wherein the lower surface and the inner surface of the housing define a cavity body together;
    a wave absorber disposed on the inner surface of the housing; and
    a filler filled in the cavity body and contacting the wave absorber and the carrier, wherein a relative permittivity of the filler is less than or equal to 2, wherein a diameter or a length of the groove is D cm, a wavelength of a radiation signal of the component to be tested adapted for the testing base is greater than or equal to $\lambda$ cm, and a depth of the cavity body is greater than or equal to $2D^2/\lambda$ cm.

2. The testing base according to claim 1, wherein a thickness of the carrier corresponding to the groove is less than 5 mm.

3. The testing base according to claim 1, wherein the carrier comprises a through hole, the through hole is located in the groove and is connected from the upper surface of the carrier to the lower surface of the carrier.

4. The testing base according to claim 1, wherein the wave absorber is further disposed on a part of the lower surface of the carrier corresponding to a part outside the groove.

5. The testing base according to claim 1, wherein the lower surface is a plane.

6. The testing base according to claim 1, wherein the lower surface is a curved surface.

7. The testing base according to claim 1, wherein an equivalent relative permittivity of the filler is between 1.2 and 1.6.

8. The testing base according to claim 1, wherein the filler comprises a plurality of filler layers, the filler layers have a plurality of different relative permittivities, and the relative permittivities of the filler layers are greater along a direction farther away from the carrier.

9. The testing base according to claim 1, wherein a material of the filler comprises foamed polytetrafluoroethylene (PTFE) or foamed polyethylene (PE) with a foaming degree between 50% and 80%.

\* \* \* \* \*